United States Patent
Diegmann (10) Patent No.: US 10,976,978 B2
(45) Date of Patent: Apr. 13, 2021

(54) ELECTRICAL MEASUREMENT DEVICE AND METHOD

(71) Applicant: Rohde & Schwarz GmbH & Co. KG, Munich (DE)

(72) Inventor: Philip Diegmann, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 560 days.

(21) Appl. No.: 15/599,109

(22) Filed: May 18, 2017

(65) Prior Publication Data
US 2018/0337686 A1 Nov. 22, 2018

(51) Int. Cl.
*G06F 3/14* (2006.01)
*G01R 13/02* (2006.01)
*G09G 5/00* (2006.01)

(52) U.S. Cl.
CPC ........... *G06F 3/14* (2013.01); *G01R 13/0236* (2013.01); *G01R 13/0254* (2013.01); *G09G 5/001* (2013.01); *G06T 2207/20056* (2013.01)

(58) Field of Classification Search
CPC ........... G06F 3/14; G06T 2207/20056; G01R 13/0254; G01R 13/0263; G01R 31/3177; G01R 31/31912; G01R 13/0236; G09G 5/001

See application file for complete search history.

(56) References Cited

U.S. PATENT DOCUMENTS

| 6,570,592 B1* | 5/2003 | Sajdak | G01R 13/02 345/440.1 |
| 2011/0060541 A1* | 3/2011 | Bartlett | G01R 13/0254 702/67 |
| 2015/0301086 A1* | 10/2015 | Schaefer | G01R 13/0263 324/76.13 |
| 2016/0299181 A1* | 10/2016 | Reich | G01R 13/0263 |

FOREIGN PATENT DOCUMENTS

EP 2293088 A2 3/2011

* cited by examiner

*Primary Examiner* — Manuel L Barbee
(74) *Attorney, Agent, or Firm* — Christensen O'Connor Johnson Kindness PLLC (57) ABSTRACT

An electrical measurement device is described with an acquisition unit that is configured to receive an input signal, a post-processing unit, and a visualization unit. The acquisition unit comprises an acquisition trigger unit and an acquisition memory, the acquisition memory being configured to acquire sampled output data and to store the sampled output data by control of the acquisition trigger unit. The post-processing unit comprises a measurement unit that is configured to process at least parts of the sampled output data and to generate processed sampled output data. The post-processing unit further comprises a measurement trigger unit that is configured to evaluate the processed sampled output data in view of a measurement trigger condition, the measurement trigger unit being configured to output a measurement trigger event if the measurement trigger con- (Continued)

dition is met. The measurement trigger unit is further configured to control the visualization unit. Moreover, a method for operating an electrical measurement device is described.

20 Claims, 3 Drawing Sheets

ELECTRICAL MEASUREMENT DEVICE AND METHOD

FIELD OF THE DISCLOSURE

Embodiments of the present disclosure relate generally to an electrical measurement device as well as a method for operating an electrical measurement device.

BACKGROUND

Known electrical measurement devices, in particular known digital oscilloscopes, comprise an acquisition unit with an acquisition trigger unit and an acquisition memory. Input data is acquired by the acquisition unit in view of an acquisition trigger condition. The acquired data can then be stored in the acquisition memory. Moreover, the acquired data can be visualized on a graphic display, on which a user can observe a curve of measured values corresponding to the input data acquired.

If the measured values change in a certain way over the time, it would be desirable for the user to be able to see the input signal which has caused that change.

SUMMARY

Accordingly, there is a need for an electrical measurement device as well as a method for operating an electrical measurement device that is capable of displaying an input signal on a graphic display, if the input signal has caused a measured value to change in a certain way Embodiments of the present disclosure provide an electrical measurement device that addresses this need, among others. The electrical measurement device comprises an acquisition unit that is configured to receive an input signal, a post-processing unit, and a visualization unit, the acquisition unit comprising an acquisition trigger unit and an acquisition memory, the acquisition memory being configured to acquire sampled output data and to store the sampled output data by control of the acquisition trigger unit, the post-processing unit comprising a measurement unit that is configured to process at least parts of the sampled output data and to generate processed sampled output data, the post-processing unit further comprising a measurement trigger unit that is configured to evaluate the processed sampled output data in view of a measurement trigger condition, the measurement trigger unit being configured to output a measurement trigger event if the measurement trigger condition is met, and the measurement trigger unit further being configured to control the visualization unit. Therefore, the sampled output data is processed such that the processed sampled output data contains certain information retrieved during the post-processing step being additional with respect to the acquisition trigger condition. This additional information can be used to be verified by applying the measurement trigger condition on the specific measurement at hand. This means that the measurement data is initially acquired while meeting a measurement acquisition trigger condition such that the sampled output data is acquired. The sampled output data acquired is then post-processed by the measurement unit that applies the measurement trigger condition on the sampled output data. Accordingly, the sampled output data already acquired and at least temporarily stored in the acquisition memory is subjected to another trigger condition, namely the measurement trigger condition that verifies if the additional information is contained in the processed sampled output data. A portion of the sampled output data satisfying the measurement trigger condition can be visualized, for instance automatically or upon request. Accordingly, the sampled output data is analyzed additionally in order to obtain a measurement value. Depending on the measurement value obtained in the post-processing analysis, the sampled output data may be visualized at least partly. In other words, the measurement value obtained generally fulfils the condition to be visualized while meeting the measurement trigger condition set which results in the output of the trigger event.

According to one aspect, the measurement trigger unit is configured to control the visualization unit such that at least a portion of the processed sampled output data is visualized by the visualization unit if the measurement trigger event is output. Therefore, a portion of the sampled output data corresponding to an input signal triggering the measurement trigger event can automatically be visualized. Further, the dedicated portion of the sampled output data is provided for being visualized upon request by a user.

According to another aspect, the measuring unit is configured to process the sampled output data with regard to at least one of frequency, period, rise time, fall time, pulse width, phase, mean value, root mean square, crest factor, standard deviation, peak-to-peak, minimum, maximum, amplitude, overshoot, undershoot, alternating current, direct current, active power, apparent power, reactive power, and power factor. Thereby the processed sampled output data comprises certain information being additional compared to the rest of the sampled output data. These certain properties can be used to define specific measurement trigger conditions that are suitable for the measurement at hand. This means that at least one of these parameters can be used as a measurement value during the post-processing analysis such that a measurement trigger condition relates to at least one of these parameters wherein fulfilling this condition results in providing the corresponding sampled output data for visualization.

In one embodiment of the present disclosure, the electrical measurement device is configured to be set by a user or a manufacturer, the user or the manufacturer making a setting for the electrical measurement device. Therefore, the electrical measurement device is adjustable to preferences of the user. For instance, the manufacturer may provide a pre-setting that is adaptable by the user, in particular by an expert user.

In a further aspect, the setting comprises at least one of halt acquiring and storing the sampled output data, continue acquiring and storing the sampled output data, store the sampled output data acquired prior to the measurement trigger event, and delete the sampled output data acquired prior to the measurement trigger event. In other words, the user may decide that the measurement at hand shall continue or that the measurement at hand shall be halted.

The measurement device may be configured to request the setting if the measurement trigger condition is met. The user is therefore requested to input whether the measurement shall continue or be halted, if and only if the measurement trigger condition is met, in particular if the measurement trigger event is output. The user can therefore decide whether or not he wants to study the input signal meeting the measurement trigger condition in more detail without additional data being taken. Moreover, the user can set the electrical measurement device such that the sampled output data acquired is deleted.

This setting can also be made in advance, for instance as a part of a basic setting such as a setting in the delivery state.

In a certain embodiment of the present disclosure, the visualization unit comprises at least one of a display and a display memory. Via the display, the visualized sampled output data can be graphically displayed, which makes the analysis of the sampled output data easier for the user. If a display memory is provided, the visualized sampled output data may be stored for later use and/or analysis. Generally, the display is configured to generate at least one of a graphical user interface and a visualization screen that may have different portions for displaying different information simultaneously.

According to one aspect, the visualization unit is configured to generate and graphically display an acquisition marker selectable by the user if the measurement trigger condition is met. Therefore, it is easy to see for the user which portions of the sampled output data have met the measurement trigger condition. The user only has to select the dedicated marker being of interest for obtaining more information with regard to the sampled output data met the measurement trigger condition. For instance, the display is a touch-sensitive one, in particular a capacitive one, such that the user can directly interact with the electrical measurement device, in particular the display. The sampled output data is already retrievable for the user, in particular temporarily stored, such that the corresponding data can be retrieved directly while selecting the marker.

According to another aspect of the present disclosure, the visualization unit is configured to graphically display at least a part of the sampled output data if the user selects the acquisition marker. Therefore, the user can simply select which of the portions meeting the measurement trigger condition shall be displayed, for example for the purpose of further analysis.

In a further aspect of the present disclosure, the electrical measurement device comprises an analog to digital converter, the input signal being digitized prior to the acquisition unit. The input signal is digitized prior to its acquisition.

In the acquisition unit, the sampled output data contains additional information for every data point, whether an acquisition trigger condition is met. This additional information may be needed by the visualization unit in order to obtain a static image of an input signal. In general, the additional information is provided by generating the sampled output data as this indicates that the acquisition trigger condition has been met.

In a certain embodiment of the present disclosure, the acquisition memory is located between the acquisition trigger unit and the post-processing unit such that the sampled output data processed by the post-processing unit is retrieved from the acquisition memory. In other words, the sampled output data is stored in the acquisition memory for immediate or later usage by the post-processing unit and the visualization unit. Hence, all data being post-processed has been acquired and stored previously by the acquisition unit, in particular stored in the acquisition memory. Accordingly, only data is post-processed that met the acquisition trigger condition previously.

Embodiments of the present disclosure also provide a method for operating an electrical measurement device. The method comprises the following steps:

receiving an input signal via an input;

generating sampled output data from the input signal by using an acquisition trigger unit;

acquiring and storing the sampled output data in an acquisition memory;

processing at least a part of the sampled output data in a post-processing unit;

evaluating the processed sampled output data in view of a measurement trigger condition by using a measurement unit and a measurement trigger unit;

outputting a measurement trigger event if the measurement trigger condition is met; and providing at least a part of the sampled output data for visualization if the measurement trigger event is output.

Therefore, the sampled output data is processed such that the processed sampled output data contains certain information retrieved during the post-processing step being additional with respect to the acquisition trigger condition. This additional information can be verified by applying the measurement trigger condition on the specific measurement at hand. Moreover, a portion of the sampled output data satisfying the measurement trigger condition can be visualized, in particular automatically or upon request.

According to a certain embodiment of the present disclosure, the sampled output data is processed with regard to at least one of frequency, period, rise time, fall time, pulse width, phase, mean value, root mean square, crest factor, standard deviation, peak-to-peak, minimum, maximum, amplitude, overshoot, undershoot, alternating current, direct current, active power, apparent power, reactive power, and power factor. Thereby, it is verified if the processed sampled output data comprises additional information compared to the rest of the sampled output data that has not met the measurement trigger condition. This additional information can be verified by applying the specific measurement trigger condition corresponding to the parameters mentioned above.

According to another aspect, the method further comprises the step of: Making a setting for the electrical measurement device. Therefore, the electrical measurement device is adjustable to preferences of the user. The setting relates to the reaction of the electrical measurement device in case that the measurement trigger condition is met.

In a further aspect of the present disclosure the setting comprises at least one of halt acquiring and storing the sampled output data, continue acquiring and storing the sampled output data, store the sampled output data acquired prior to the measurement trigger event, and delete the sampled output data acquired prior to the measurement trigger event. In other words, the user may decide that the measurement at hand shall continue or that the measurement at hand shall be halted. Alternatively, the sampled output data acquired can be deleted if the user decides to delete this data.

The setting may be requested if the measurement trigger condition is met. The user is therefore requested to input whether the measurement shall continue or be halted, if and only if the measurement trigger condition is met, in particular if the measurement trigger event is output. The user can therefore decide whether or not he wants to study the input signal meeting the measurement trigger condition in more detail without additional data being taken.

Alternatively, this setting is set previously as a part of a basic setting such that the reaction of the electrical measurement device is predefined in case that the measurement trigger condition is met.

According to one embodiment of the present disclosure, a logger view is displayed, the logger view illustrating the sampled output data. In particular, a curve of an input signal voltage over time is displayed in the logger view. This curve relates to measurement values obtained. The advantage of the logger view is that it yields an overview where the user can observe trends of the measurement values over relatively large time scales. The measurement values illustrated in the logger view may correspond to the sampled output data acquired in the acquisition memory.

According to another embodiment the logger view indicates processed sampled output data by at least one corresponding acquisition marker graphically displayed if the measurement trigger condition is met, the acquisition marker being selectable by the user. Therefore, it is easy to recognize for the user which portions of the sampled output data have met the additional measurement trigger condition.

A scope view may be displayed if the user selects the acquisition marker, the scope view illustrating at least a part of the sampled output data view. The scope view is a detailed view of a portion of the sampled output data meeting the measurement trigger condition. Therefore, the user can analyze the portion in more detail than possible for example in the logger view. Further, this ensures that only those portions are displayed in detail being of interest while meeting the additional measurement trigger condition. Accordingly, portions of the input signal are displayed in the scope view which has the additional information with respect to the rest of the input signal. The additional information corresponds to meeting both the acquisition trigger condition and the measurement trigger condition.

In a certain embodiment of the present disclosure, the output signal corresponds to the input signal being digitized. Therefore, the sampled output data is a digitized representative of the input signal.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
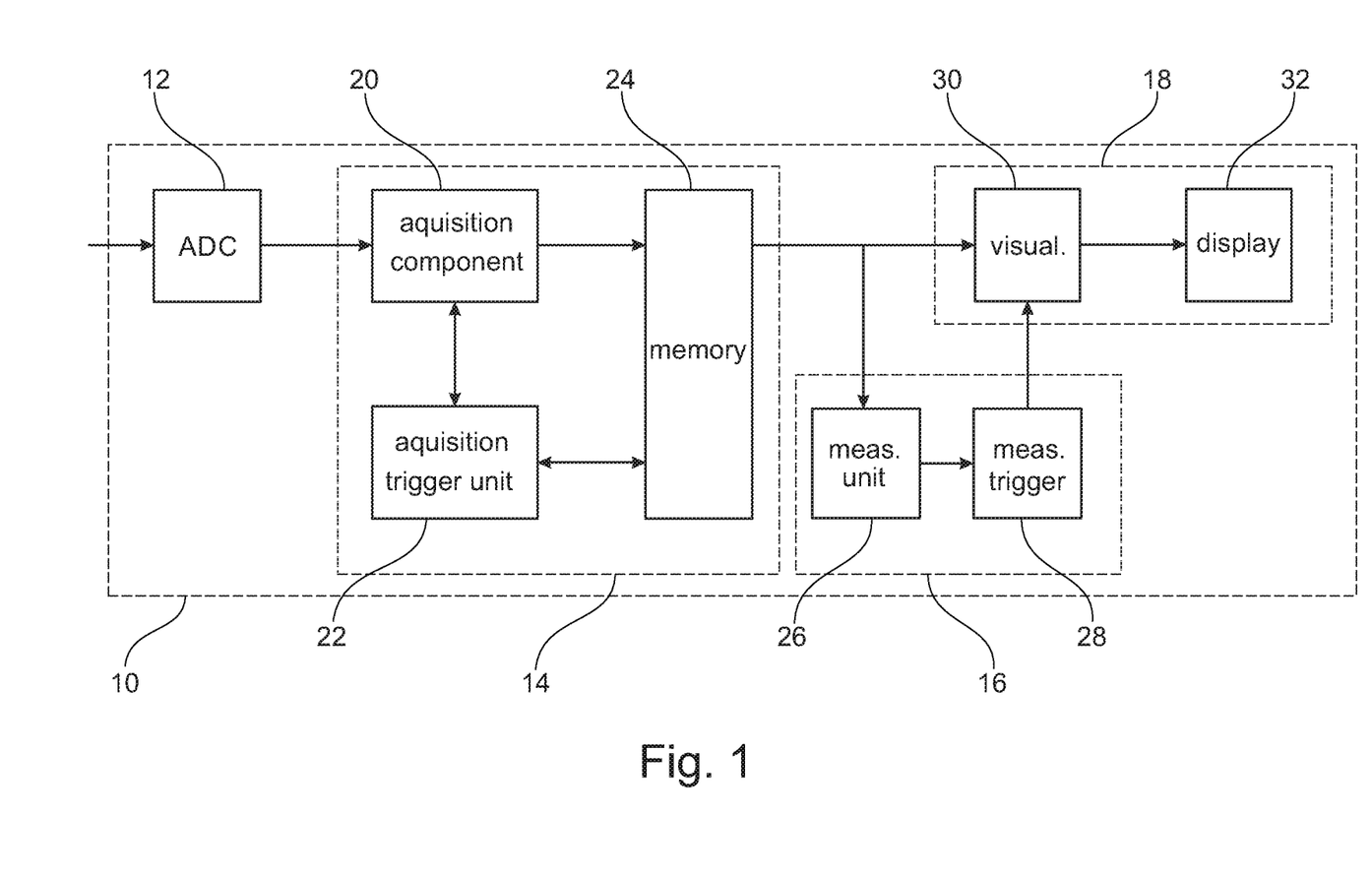
FIG. 1 shows a schematic overview of one representative embodiment of an electrical measurement device according to the disclosure.

In FIG. 1, an electrical measurement device 10 is shown that comprises an analog to digital converter 12, an acquisition unit 14, a post-processing unit 16, and a visualization unit 18. The arrows in FIG. 1 depict the flow of data and/or signals within the electrical measurement device 10. The electrical measurement device 10 may be an oscilloscope, in particular a digital oscilloscope.

The acquisition unit 14 comprises an acquisition component 20 connected to the analog to digital converter 12, an acquisition trigger unit 22 and an acquisition memory 24, wherein the acquisition trigger unit 22 is connected to both the acquisition component 20 and the acquisition memory 24. Additionally, the acquisition memory 24 is connected to the acquisition component 20.

The post-processing unit 16 comprises a measurement unit 26, which is connected to the acquisition memory 24, and a measurement trigger unit 28 connected to the measurement unit 26.

The visualization unit 18 comprises a visualization component 30, which is connected to both the acquisition memory 24 and the measurement trigger unit 28, and a display 32 connected to the visualization component 30. The visualization unit 18 may further comprise a visualization memory for storing data that is to be graphically displayed on the display 32.

In general, the acquisition unit 14 is configured to receive an input signal that is inputted to an input of the electrical measurement device 10 and digitized by the analog to digital converter 12 previously.

The acquisition component 20 is configured to receive the digitized input signal from the analog to digital converter 12 and to generate sampled output data from the digitized input signal.

The sampled output data is stored in the acquisition memory 24 by control of the acquisition trigger unit 22. In other words, besides time and voltage, the sampled output data stored in the acquisition memory 24 contains additional information for every data point whether an acquisition trigger condition is met. This additional information is provided as the sampled output data corresponds to the input signal at a predetermined acquisition trigger level. Hence, the sampled output data is generated only if the acquisition trigger condition is met.

The measurement unit 26 is configured to retrieve at least parts of the sampled output data stored in the acquisition memory 24 and to generate processed sampled output data from at least a part of the sampled output data.

The acquisition memory 24 is located between the acquisition trigger unit 22 and the post-processing unit 16 ensuring that the sampled output data processed by the post-processing unit 16 is retrieved from the acquisition memory 24. Accordingly, the measurement unit 26 of the post-processing unit 16 processes the sampled output data, in particular measures a certain parameter to be used by the measurement trigger unit 28 afterwards, wherein the sampled output data is retrieved from the acquisition memory 24 ensuring that the acquisition trigger condition has already met previously.

For example, the measurement unit 26 may be configured to perform a fast Fourier transform (FFT) of at least a part of the sampled output data from time domain to frequency domain. By using the FFT, frequencies contained within the sampled output signal can be computed. In this case, the processed sampled output data comprises additional information about the frequency content of the sampled output data.

The measurement trigger unit 28 is configured to receive and evaluate the processed sampled output data in view of a predetermined measurement trigger condition. The predetermined measurement trigger condition may be adjustable by a user of the electrical measurement device 10. Moreover, the predetermined measurement trigger condition may comprise of at least one condition concerning at least one of frequency, period, rise time, fall time, pulse width, phase, mean value, root mean square, crest factor, standard deviation, peak-to-peak, minimum, maximum, amplitude, overshoot, undershoot, alternating current, direct current, active power, apparent power, reactive power, and power factor.

These parameters can be used as trigger conditions applied by the measurement trigger unit 28 appropriately. Typically, the processed sampled output data comprise at least one of these parameters used as measurement trigger condition.

Referring to the example given above, the measurement trigger condition in that case may be that certain frequencies are contained within the sampled output data.

The measurement trigger unit 28 is configured to output a measurement trigger event if the predetermined measurement trigger condition is met.

The electrical measurement device 10 may be configured to be set to perform at least one of halt acquiring and storing the sampled output data, continue acquiring and storing the sampled output data, store the sampled output data acquired prior to the measurement trigger event, and delete the sampled output data acquired prior to the measurement trigger event, in particular if the measurement trigger event is output.

The electrical measurement device 10 may be preset by a manufacturer or the user to perform any of the actions stated above, and the presetting may be adjustable by the user.

Moreover, the electrical measurement device 10 may be configured to request the setting if the predetermined measurement trigger condition is met, in particular if the measurement trigger condition is output.

The measurement trigger unit 28 is configured to control the visualization unit 18. For instance, at least a part of the sampled output data can be visualized if the predetermined measurement trigger condition is met. Hence, if the measurement trigger event is output, the measurement trigger unit 28 controls the visualization unit 18 to provide data of at least a portion of the processed sampled output data for visualization purposes.

In other words, the visualization unit 18 is configured to generate visualized sampled output data from the sampled output data by control of the measurement trigger unit 28.

For visualizing purposes, the visualization unit 18 may comprise a display 32 and a display memory connected to the display 32 for buffering data to be displayed. In the shown embodiment, the display memory is integrated in the display 32.

Figure 2:
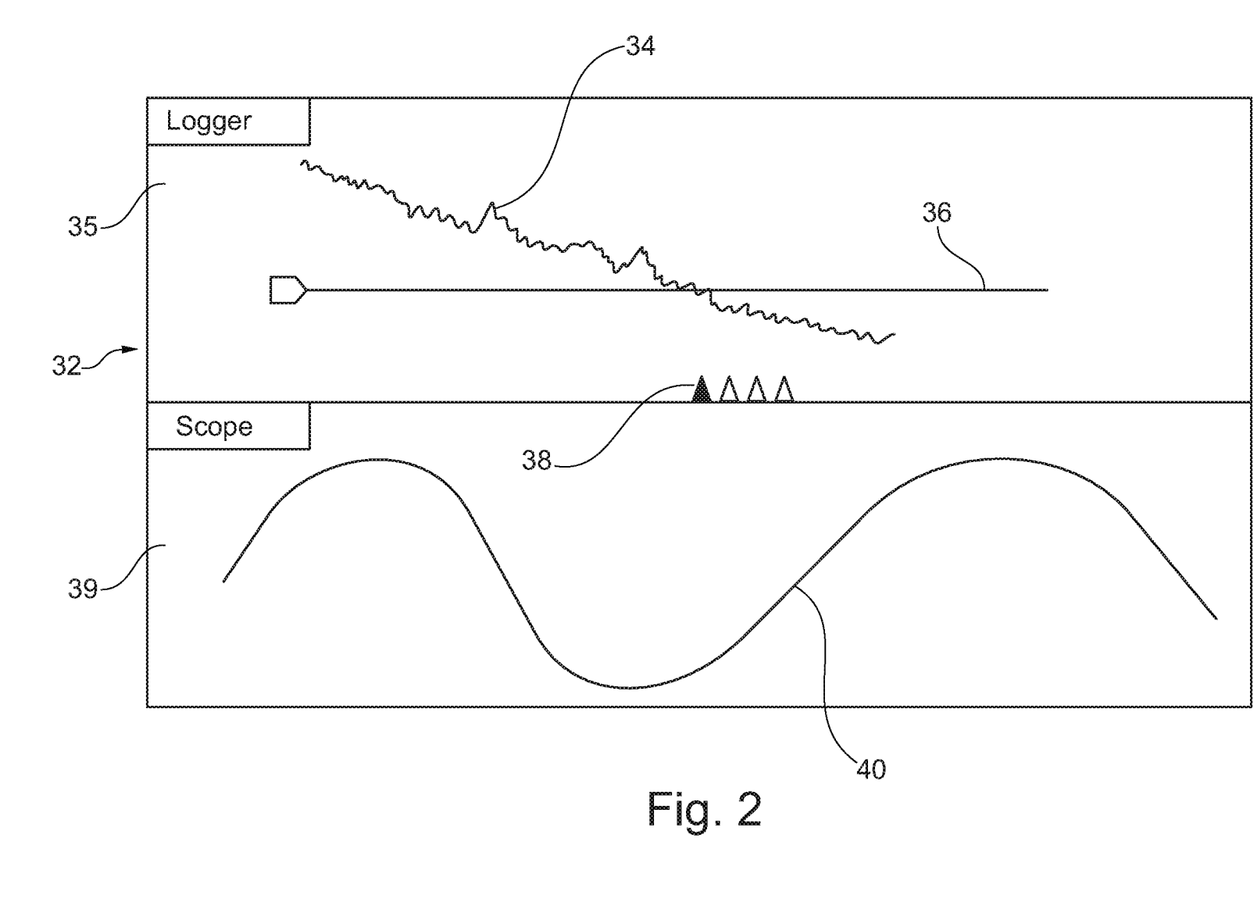
FIG. 2 shows a schematic view of a display of one representative embodiment of an electrical measurement device according to the disclosure.

Accordingly, the display 32 is configured to receive and graphically display the visualized sampled output data, which will be described in more detail below by reference to FIG. 2, which shows a schematic view of the display 32.

A measurement value curve 34 is depicted in an upper portion 35 of the display 32 (logger view), wherein the measurement value curve 34 may be a voltage of the sampled output signal plotted against time. The measurement value curve 34 relates to certain measurement values acquired appropriately. Thus, the measurement values illustrated have at least met the acquisition trigger condition.

Part of a measurement trigger condition may be that the voltage of the sampled output signal is below a certain threshold, which threshold may be adjustable by the user. In FIG. 2, the threshold is depicted by a measurement trigger line 36. This measurement trigger line 36 can be set by the user while touching the display 32 appropriately. Thus, the display 32 may be a touch-sensitive one, in particular a capacitive one.

As stated above, the measurement trigger unit 28 is configured to output a measurement trigger event if the measurement trigger condition is met and to control the visualization unit 18 accordingly. Moreover, the visualization unit 18 is configured to generate an acquisition marker 38 if the measurement trigger condition is met, in particular if the measurement trigger event is output.

The visualization unit 18 may be configured to generate a new acquisition marker 38 each time the measurement trigger condition is met. In other words, the visualization unit 18 may generate several acquisition markers 38, one for each time a measurement trigger event is output. The visualization unit 18 is also configured to graphically display the acquisition markers 38 on the display 32.

The acquisition markers 38 may be selectable by the user, wherein the visualization unit 18 is configured to graphically display at least part of the sampled output data corresponding to the respective measurement trigger event on a lower portion 39 of the display 32 (scope view), if the user selects the acquisition marker 38. The scope view is a detailed view of the sampled output data, having a higher resolution than the logger view, in particular a higher time resolution. The scope view may display the sampled output data corresponding to the respective measurement trigger event as a curve 40, which curve 40 may be a plot of voltage over time. The curve 40 is also called trace.

Accordingly, the visualized sampled output data generated by the visualization unit 18 comprises processed sampled output data.

Figure 3:
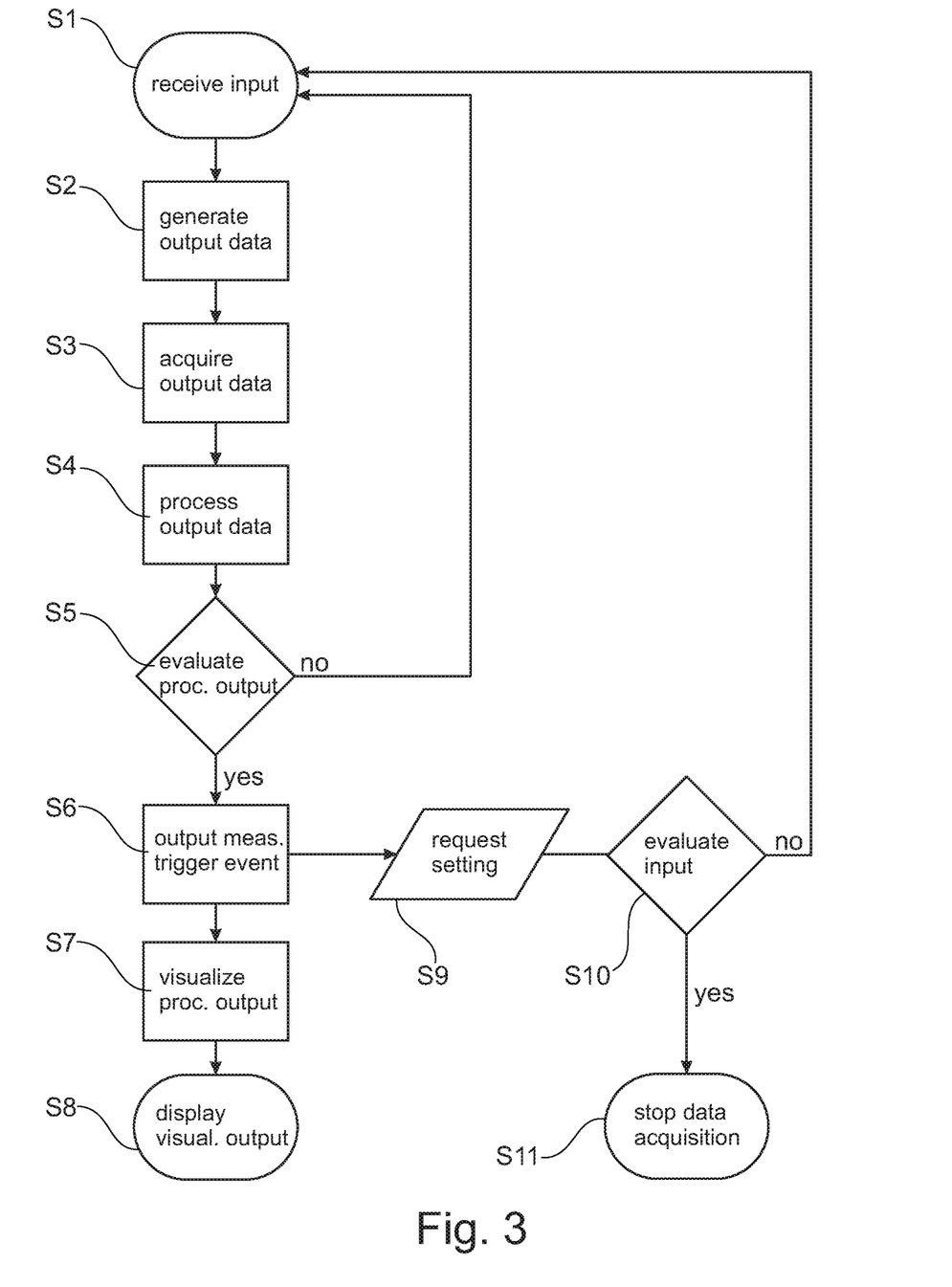
FIG. 3 shows a schematic flow chart of one embodiment of a method according to the disclosure.

A method for operating the electrical measurement device 10 is illustrated in FIG. 3. When an input signal is received via an input (step S1), the input signal is digitized by the analog to digital converter 12. The digitized input signal is then forwarded to the acquisition component 20.

From the digitized input signal, the acquisition component 20 generates sampled output data by control of the acquisition trigger unit 22 (step S2). The sampled output data comprises, besides time and voltage, additional information for every data point, whether an acquisition trigger condition is met.

The sampled output data is then acquired and stored by the acquisition memory 24 (step S3).

As a next step, at least a part of the sampled output data is retrieved from the acquisition memory 24 by the measurement unit 26. At least a part of the sampled output data (at least temporarily) stored is now processed by the measurement unit 26 to generate processed sampled output data (step S4). The processed sampled output data may comprise at least one of the following parameters: frequency, period, rise time, fall time, pulse width, phase, mean value, root mean square, crest factor, standard deviation, peak-to-peak, minimum, maximum, amplitude, overshoot, undershoot, alternating current, direct current, active power, apparent power, reactive power, and power factor.

Next, the processed sampled output data is evaluated in view of a measurement trigger condition (step S5) by the measurement trigger unit. The measurement trigger condition may imply conditions concerning at least one of frequency, period, rise time, fall time, pulse width, phase, mean value, root mean square, crest factor, standard deviation, peak-to-peak, minimum, maximum, amplitude, overshoot, undershoot, alternating current, direct current, active power, apparent power, reactive power, and power factor. Thus, the same parameters as obtained during the post-processing by the measurement unit 26 may be applied by the measurement trigger unit 28 in order to verify if the processed sampled output data has met the measurement trigger condition.

If the measurement trigger condition is not met, steps S1 to S5 are repeated for a subsequent set of input signals.

If the measurement trigger condition is met, a measurement trigger event is output by the measurement trigger unit 28 (step S6) and at least part of the sampled output data is provided for visualization by the visualization component 30 (step S7). In other words, visualized sampled output data is generated by the visualization component 30 that can be visualized on the display 32.

The visualized sampled output data may be (temporarily) stored in the display memory. Upon demand, the visualized sampled output data is then graphically displayed on the display 32 (step S8). Accordingly, the visualized sampled output data comprises the processed sampled output data that has met the measurement trigger condition. However, the visualized sampled output data may also comprise sampled output data retrieved from the acquisition memory 24 as will be described in more detail in the following, also referring to FIG. 2.

Independent of whether the measurement trigger event is output, a graphical representation of the sampled output signal over time can be displayed in an upper portion 35 of the display 32, in the so-called logger view. Thus, the logger view illustrates the measurement values of the input signal being acquired which means that the measurement values illustrated have met the acquisition trigger condition.

If a measurement trigger event is output, an acquisition marker 38 is generated by the visualization component 30 and graphically displayed on the display 32. An additional acquisition marker 38 is generated and displayed each time a measurement trigger event is output.

The acquisition markers 38 may be selectable by the user in order to retrieve the corresponding data related to the dedicated acquisition marker 38. If the user selects one of the acquisition markers 38, a detailed view (scope view), i.e. a view with a higher resolution than the logger view, of the corresponding sampled output signal or at least a portion thereof is displayed as a curve 40 in a lower portion 39 of the display 32. This corresponding sampled output signal relates to the processed sampled output data that has been verified by the measurement unit 16 appropriately while applying the measurement trigger condition.

Additionally, at least part of the measurement trigger condition may be graphically displayed in the upper portion 35 of the display 32. For example, a measurement trigger line 36 representing a voltage threshold adjustable by the user may be displayed as shown in FIG. 2.

When a measurement trigger event is output, the user may be requested to make a setting which may comprise at least one of halt acquiring and storing the sampled output data, continue acquiring and storing the sampled output data, store the sampled output data acquired prior to the measurement trigger event, and delete the sampled output data acquired prior to the measurement trigger event (step S9).

Alternatively, the setting may be a presetting set by the user or the manufacturer previously. The presetting may be adjustable by the user.

Alternatively to providing markers corresponding to the sampled output data to be visualized, the respective data may be graphically displayed automatically.

The automated visualization or the requesting may be set previously. For instance, a certain mode can be selected that corresponds to the different visualization concepts (automatic/on demand).

As an example, an embodiment where the user is requested to input whether the acquisition and storage of the sampled output data should be halted will be discussed in the following.

If the user inputs (step S10) that the acquisition and storage of the sampled output data should be halted, acquisition of data and storage of data is stopped (step S11).

If the user inputs (step S10) that the acquisition and storage of the sampled output data should not be halted, at least steps S1 to S5 are executed for a subsequent set of input signals.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An electrical measurement device, comprising:
an acquisition unit that is configured to receive an input signal,
a post-processing unit, and
a visualization unit,
said acquisition unit comprising an acquisition trigger unit and an acquisition memory, said acquisition memory being configured to acquire sampled output data and to store said sampled output data by control of said acquisition trigger unit,
said post-processing unit comprising a measurement unit that is configured to process at least parts of said sampled output data and to generate processed sampled output data, wherein the sampled output data is processed by the measurement unit such that the processed sampled output data contains additional information compared to the sampled output data,
said post-processing unit further comprising a measurement trigger unit that is configured to evaluate said processed sampled output data in view of a measurement trigger condition,
said measurement unit being established separately from the measurement trigger unit,
said measurement unit being configured to process the sampled output data, wherein a certain parameter to be used by the measurement trigger unit afterwards is measured,
said measurement trigger unit being configured to output a measurement trigger event if said measurement trigger condition is met, and said measurement trigger unit further being configured to control said visualization unit, wherein said visualization unit is configured to generate and graphically display an acquisition marker selectable by a user if said measurement trigger condition is met, and wherein said visualization unit is configured to graphically display at least a part of said sampled output data meeting said measurement trigger condition if a user selects said acquisition marker.

2. The electrical measurement device according to claim 1, wherein said measurement trigger unit is configured to control said visualization unit such that at least a portion of said processed sampled output data is visualized by said visualization unit if said measurement trigger event is output.

3. The electrical measurement device according to claim 1, wherein said measuring unit is configured to process said sampled output data with regard to at least one of frequency, period, rise time, fall time, pulse width, phase, mean value, root mean square, crest factor, standard deviation, peak-to-peak, minimum, maximum, amplitude, overshoot, undershoot, alternating current, direct current, active power, apparent power, reactive power, and power factor.

4. The electrical measurement device according to claim 1, wherein said electrical measurement device is configured to be set by a user or a manufacturer, the user or the manufacturer making a setting for said electrical measurement device.

5. The electrical measurement device according to claim 4, wherein said setting comprises at least one of halt acquiring and storing said sampled output data, continue acquiring and storing said sampled output data, store said sampled output data acquired prior to said measurement trigger event, and delete said sampled output data acquired prior to said measurement trigger event.

6. The electrical measurement device according to claim 4, wherein said measurement device is configured to request said setting if said measurement trigger condition is met.

7. The electrical measurement device according to claim 1, wherein said visualization unit comprises at least one of a display and a display memory.

8. The electrical measurement device according to claim 1, wherein said electrical measurement device comprises an analog to digital converter, said input signal being digitized prior to the acquisition unit.

9. The electrical measurement device according to claim 1, wherein said acquisition memory is located between said acquisition trigger unit and said post-processing unit such that said sampled output data processed by said post-processing unit is retrieved from said acquisition memory.

10. A method for operating an electrical measurement device, comprising the steps of:
receiving an input signal via an input;
generating sampled output data from said input signal by using an acquisition trigger unit;
acquiring and storing said sampled output data in an acquisition memory;
processing at least a part of said sampled output data in a post-processing unit, thereby obtaining processed sampled output data, wherein the sampled output data is processed such that the processed sampled output data contains additional information compared to the sampled output data;
evaluating said processed sampled output data in view of a measurement trigger condition by using a measurement unit and a measurement trigger unit,
wherein said measurement unit is established separately from the measurement trigger unit;
processing the sampled output data by means of the measurement unit, wherein a certain parameter to be used by the measurement trigger unit afterwards is measured;
outputting a measurement trigger event if said measurement trigger condition is met;
providing at least a part of said sampled output data for visualization if said measurement trigger event is output, and
generating and graphically displaying an acquisition marker selectable by a user if said measurement trigger condition is met, wherein at least a part of said sampled output data meeting said measurement trigger condition is graphically displayed if a user selects said acquisition marker.

11. The method for operating an electrical measuring device according to claim 10, wherein said sampled output data is processed with regard to at least one of frequency, period, rise time, fall time, pulse width, phase, mean value, root mean square, crest factor, standard deviation, peak-to-peak, minimum, maximum, amplitude, overshoot, undershoot, alternating current, direct current, active power, apparent power, reactive power, and power factor.

12. The method for operating an electrical measurement device according to claim 10, wherein the method further comprises:
making a setting for said electrical measurement device.

13. The method for operating an electrical measuring device according to claim 12, wherein said setting comprises at least one of halt acquiring and storing said sampled output data, continue acquiring and storing said sampled output data, store said sampled output data acquired prior to said measurement trigger event, and delete said sampled output data acquired prior to said measurement trigger event.

14. The method for operating an electrical measuring device according to claim 12, wherein said setting is requested if said measurement trigger condition is met.

15. The method for operating an electrical measuring device according to claim 10, wherein a logger view is displayed, said logger view illustrating said sampled output data.

16. The method for operating an electrical measuring device according to claim 15, wherein said logger view indicates processed sampled output data by at least one corresponding acquisition marker graphically displayed if said measurement trigger condition is met, said acquisition marker being selectable by a user.

17. The method for operating an electrical measuring device according to claim 16, wherein a scope view is displayed if the user selects said acquisition marker, said scope view illustrating at least a part of said sampled output data view.

18. The method for operating an electrical measuring device according to claim 10, wherein said output signal corresponds to said input signal being digitized.

19. An electrical measurement device, comprising:
an acquisition unit that is configured to receive an input signal;
a post-processing unit; and
a visualization unit,
said acquisition unit comprising an acquisition trigger unit and an acquisition memory, said acquisition memory being configured to acquire sampled output data and to store said sampled output data by control of said acquisition trigger unit, said post-processing unit comprising a measurement unit that is configured to process at least parts of said sampled output data and to generate processed sampled output data, said post-processing unit further comprising a measurement trigger unit that is configured to evaluate said processed sampled output data in view of a measurement trigger condition, said measurement unit being established separately from the measurement trigger unit, said measurement unit being configured to processes the sampled output data, wherein a certain parameter to be used by the measurement trigger unit afterwards is measured, said measurement trigger unit being configured to output a measurement trigger event if said measurement trigger condition is met, and said measurement trigger unit further being configured to control said visualization unit, wherein said measuring unit is configured to process said sampled output data with regard to at least one of frequency, period, rise time, fall time, pulse width, phase, mean value, root mean square, crest factor, standard deviation, peak-to-peak, minimum, maximum, amplitude, overshoot, undershoot, alternating current, direct current, active power, apparent power, reactive power, and power factor, wherein said visualization unit is configured to generate and graphically display an acquisition marker selectable by a user if said measurement trigger condition is met, and wherein said visualization unit is configured to graphically display at least a part of said sampled output data meeting said measurement trigger condition if a user selects said acquisition marker.

20. The electrical measurement device according to claim 1, wherein said visualization unit is configured to generate and graphically display:

a logger view displayed in one portion of a display, said logger view indicating processed sampled output data by said at least one corresponding acquisition marker graphically displayed if said measurement trigger condition is met; and a scope view displayed in another portion of said display if the user selects said acquisition marker, the scope view being a detailed view of a portion of said sampled output data meeting the measurement trigger condition.

\* \* \* \* \*